United States Patent [19]
Sonoda

[11] Patent Number: 5,603,778
[45] Date of Patent: Feb. 18, 1997

[54] METHOD OF FORMING TRANSPARENT CONDUCTIVE LAYER, PHOTOELECTRIC CONVERSION DEVICE USING THE TRANSPARENT CONDUCTIVE LAYER, AND MANUFACTURING METHOD FOR THE PHOTOELECTRIC CONVERSION DEVICE

[75] Inventor: Yuichi Sonoda, Tsuzuki-gun, Japan

[73] Assignee: Canon Kabushiki Kaisha, Tokyo, Japan

[21] Appl. No.: 424,172

[22] Filed: Apr. 19, 1995

[30] Foreign Application Priority Data

Apr. 27, 1994 [JP] Japan ................................ 6-089056

[51] Int. Cl.$^6$ ..................... H01L 31/075; H01L 31/20; C23C 14/34
[52] U.S. Cl. ..................... 136/259; 136/256; 136/258; 257/53; 257/55; 257/436; 257/458; 437/2; 437/4; 437/181; 204/192.29
[58] Field of Search ..................... 204/192.29; 136/256, 136/258 AM, 259; 257/53, 55, 436, 458; 437/2, 4, 181

[56] References Cited

U.S. PATENT DOCUMENTS

| 4,532,372 | 7/1985 | Nath et al. | 136/256 |
| 4,598,306 | 7/1986 | Nath et al. | 257/458 |
| 5,324,365 | 6/1994 | Niwa | 136/256 |
| 5,342,452 | 8/1994 | Saito et al. | 136/256 |
| 5,352,300 | 10/1994 | Niwa | 136/256 |
| 5,453,135 | 9/1995 | Nakagawa et al. | 136/259 |

FOREIGN PATENT DOCUMENTS 60-41878 9/1985 Japan ..................... 136/259

Primary Examiner—Aaron Weisstuch
Attorney, Agent, or Firm—Fitzpatrick, Cella, Harper & Scinto

[57] ABSTRACT

A photoelectric conversion device which has high conversion efficiency and high reliability, and a manufacturing method to make the photoelectric conversion device at a low cost are provided by improving a method of forming a transparent conductive metal oxide film to achieve stable film production for a long period of time and to prevent deterioration in transparency and resistance of such an oxide layer otherwise caused by high-rate film formation. In a method of manufacturing a photoelectric conversion device which comprises a reflecting layer at least one surface of which has high reflectivity to light, and a transparent conductive oxide layer formed by a sputtering process, a thin film semiconductor junction laminate a transparent electrode which are formed on the reflecting layer in this order, the metal oxide layer is formed by sputtering in which a metal oxide target having specific resistance not larger than 5.0 Ωcm and a crystal particle size not larger than 15 μm is employed and discharge is developed using a gas mixture of an Ar gas with 0.1 to 10% added oxygen ($O_2$).

32 Claims, 6 Drawing Sheets

METHOD OF FORMING TRANSPARENT CONDUCTIVE LAYER, PHOTOELECTRIC CONVERSION DEVICE USING THE TRANSPARENT CONDUCTIVE LAYER, AND MANUFACTURING METHOD FOR THE PHOTOELECTRIC CONVERSION DEVICE

BACKGROUND OF THE INVENTION

1. Field of the Invention

The present invention relates to a method of forming a transparent conductive layer, which is uniform in film quality and thickness, by a sputtering process, a photoelectric conversion device using the transparent conductive layer, which has high reliability and can be easily mass-produced, and a manufacturing method for the photoelectric conversion device.

2. Description of the Related Art

Energy consumed by human beings at the present time greatly depends on thermal-power generation using fossil fuels such as petroleum products and coal, and nuclear power generation. But there are many problems in continuing to rely in the future on a large scale upon fossil fuels which generate carbon dioxide when burnt and which are responsible for warming of the atmosphere around the earth. Nuclear power is not totally free from a risk of exposure to radiation even during normal operation, as well as the possibility of accidental exposure. Therefore, solar power generation using photoelectric conversion devices, that barely affect the earth's environment, have received attention and further extensive use thereof is expected.

The current state in the field of solar power generation, however, faces several problems that hinder its widespread practical use.

Heretofore, solar cells for use in solar power generation have been formed of single-crystal or polycrystalline silicon. But these solar cells require not only a lot of energy and time for growth of crystals, but also complicated steps after the growth of crystals, and hence it is difficult to mass-produce the solar cells efficiently at a low cost. Meanwhile, the so-called thin film semiconductor solar cells using amorphous silicon (hereinafter referred to as a-Si) or compound semiconductors such as CdS and CuInSe$_2$ have been intensively researched and developed. These thin film semiconductor solar cells can be manufactured by forming the necessary semiconductor layers on an inexpensive base plate made of glass, stainless steel, etc., with relatively simple steps, and hence have a good possibility that their production cost can be reduced. However, because of lower conversion efficiency than crystalline silicon solar cells and uncertain reliability for long-term use, the thin film semiconductor solar cells have not yet been used on a large scale. To solve such problems and improve performance of the thin film semiconductor solar cells, various measures have been proposed as follows.

One proposal is to provide a rear reflecting layer to increase reflectivity of light-at the front surface of the base plate for returning part of the incident light (such as sunlight), which has not been absorbed by the thin film semiconductor layers, to the thin film semiconductor layers, i.e., to more effectively utilize the incident light. To this end, in the case of using a base plate transparent to light that is absorbed by the semiconductor layers and introducing the light from the base plate side, an electrode is formed of a metal having high reflectivity, such as silver (Ag), aluminum (Al) and copper (Cu), on a surface of the thin film semiconductor layers after forming them. On the other hand, in the case of introducing the light from the surface of the thin film semiconductor layers, the semiconductor layers are formed after forming a similar metal layer on the base plate.

Further, by interposing a transparent layer having suitable optical properties between the metal layer and the semiconductor layers, reflectivity can be increased based on the multiple interference effect as shown in FIG. 2. FIGS. 2A and 2B show, by way of example, results of simulation tests and prove that reflectivity is increased by interposing zinc oxide (ZnO) as a transparent conductive layer between silicon and each of various metals.

The use of the transparent conductive layer is also effective in increasing reliability of the thin film solar cells. For example, Japanese Patent Publication No. 60-41878 discloses that the semiconductor and the metal are prevented from intermixing to form an alloy by the presence of the transparent layer. U.S. Pat. No. 4,532,372 and U.S. Pat. No. 4,598,306 disclose that, by using a transparent conductive layer which has a suitable resistance value, an excessive current is prevented from flowing between the electrodes even if the semiconductor layers are short-circuited somewhere.

Using only the above-described measures, however, desired requirements of a photoelectric conversion device cannot be obtained. Thus, solar cells using thin film semiconductors as a photoelectric conversion device are now in a state such that there is a good possibility for producing such solar cells at a low cost, but they have not yet been used on a large scale for solar power generation.

SUMMARY OF THE INVENTION

In view of the state of art described above, an object of the present invention is to provide a photoelectric conversion device which has high conversion efficiency and high reliability, and a manufacturing method to make the photoelectric conversion device at a low cost, by improving a method of forming a metal oxide film so as to achieve stable film formation over a long time period and to prevent a deterioration in the characteristics thereof, such as deterioration in transparency and resistance of a metal oxide layer otherwise caused by high-rate film formation.

According to one feature of the present invention, in a method of manufacturing a photoelectric conversion device which comprises a reflecting layer, at least one surface of which has high reflectivity to light, a metal oxide layer, a thin film semiconductor junction, and a transparent electrode, the metal oxide layer is formed by sputtering in which a metal oxide target having a specific resistance not larger than 5.0 Ωcm and a crystal particle size not larger than 15 µm is employed and discharge is developed using a gas mixture of Ar gas to which 0.1 to 10% oxygen (O$_2$) gas is added.

According to another feature of the present invention, in a method of manufacturing a photoelectric conversion device which has a transparent electrode formed of a transparent conductive metal oxide film by a sputtering process, the sputtering utilizes a metal oxide target having specific resistance not larger than 5.0 Ωcm and a crystal particle size not larger than 15 µm and discharge is developed using a gas mixture of Ar gas to which 0.1 to 1% oxygen (O$_2$) gas is added.

According to yet another feature of the present invention, in a method of manufacturing a photoelectric conversion device which comprises a reflecting layer, at least one surface of which has high reflectivity to light, a transparent conductive metal oxide layer, a thin film semiconductor junction, and a transparent electrode formed of a transparent conductive metal oxide film by a sputtering process, the transparent conductive metal oxide layer is formed by sputtering in which an oxide target having specific resistance not larger than 5.0 $\Omega$cm and a crystal particle size not larger than 15 µm is employed and discharge is developed using a gas mixture of Ar gas to which 0.1 to 1% oxygen ($O_2$) gas is added.

Preferably, the specific resistance of the target is set to be in the range of 1 to 5 $\Omega$cm with variations not larger than ±30% on the target surface.

The above object is achieved with the features of the present invention set forth above.

DESCRIPTION OF THE PREFERRED EMBODIMENTS

Figure 1:
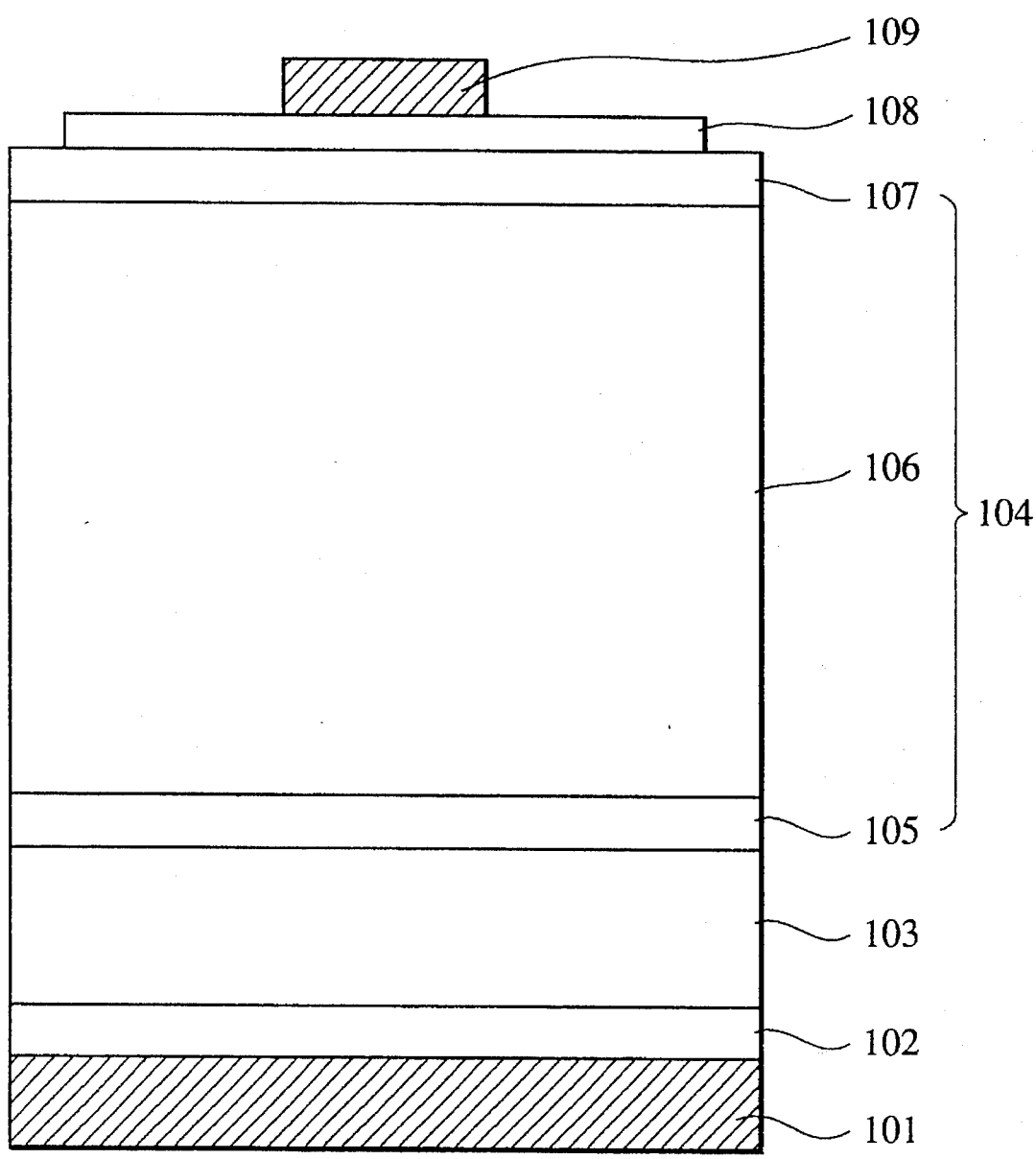
FIG. 1 is a schematic sectional view showing one example of a solar cell as a photoelectric conversion device to which the present invention is suitably applied.
Figure 2A:
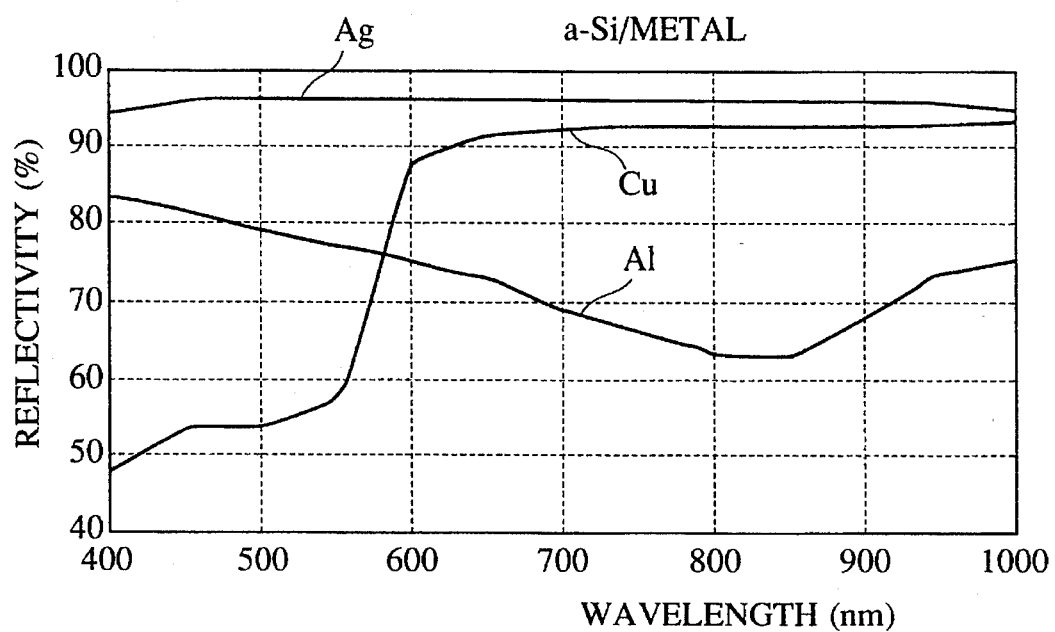
FIG. 2 is a graph showing the effect of ZnO on reflectivity at the interface between a silicon layer and a metal layer.
Figure 2B:
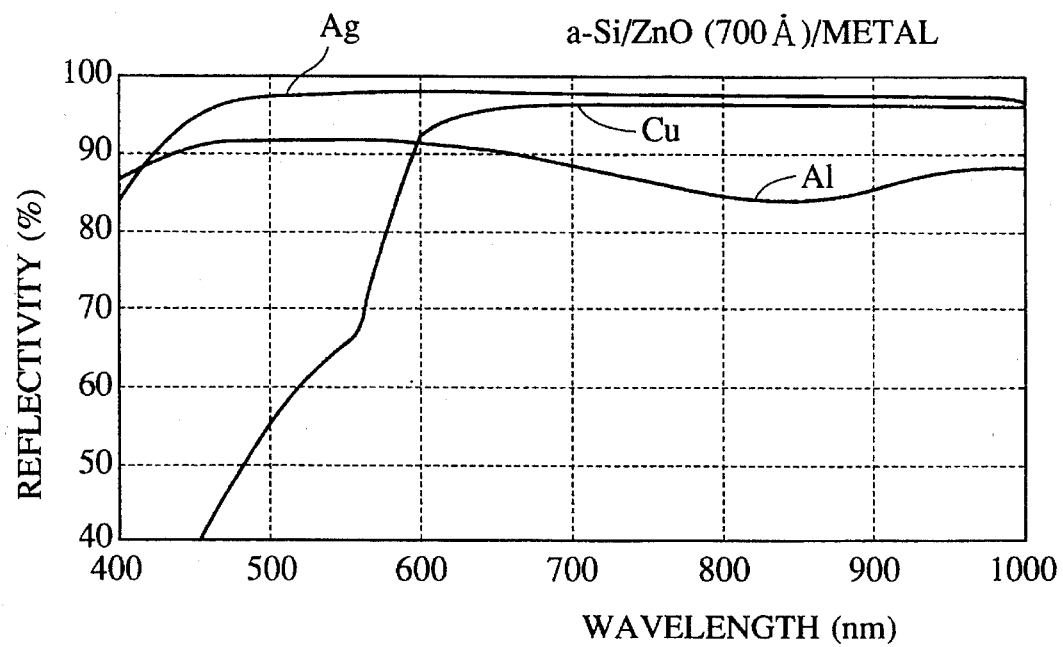

Operation and embodiments of the present invention will be described below in detail with reference to experiments made in the course of studies to accomplish the present invention.

The inventors have found from results of various experiments that the following factors are particularly important in continuous film formation, i.e., in a film formation process by sputtering operating for several hours. More specifically, whether or not high-rate film formation (not less than 50 Å/sec) can be stably continued by sputtering for a long period of time is an important key for mass-producing semiconductor solar cells having transparent layers. While there occur no significant troubles in a low-rate film formation, i.e., not higher than 20 Å/sec, under high-rate film formation conditions discharge is not developed in some cases, or short-circuits occur during discharge, and discharge is intermittently produced or completely stopped.

The term "short-circuiting" means a phenomenon wherein the voltage drifts in an abnormal way during discharge, causing the discharge to become unstable or to be temporarily cut off. The occurrence of a short-circuit leads to adverse effects such as a reduction in the film formation rate, variations in distribution of film thickness, and a deterioration in film quality due to defects or other damage, giving rise to a serious problem in continuous film formation. Also, if a short-circuit occurs, the discharge in some cases is not self-recovering, raising a serious problem in productivity.

It is thought that the short-circuiting is attributable to the target itself or to minute dielectric particles on the target surface. In the former case, the short-circuiting is caused by excessive emission due to a high electric field being concentrated on an air bubble resulting from a low target density (denseness) or a pointed projection on the target, or is due to a very high resistance value of the target (discharge is not developed unless the resistance value is less than a certain value). In high-rate film formation (not less than 50 Å/sec), particularly, the short-circuiting is more likely to occur for this reason. In the latter case, the short-circuiting is caused by dust or the like deposited on the target surface.

As mentioned above, if a short-circuit occurs and the discharge is no longer self-recovering during continuous film forming, a serious problem in providing stable film quality occurs. To avoid that problem, it is conceivable to use, as a metal oxide target, a target of reduced resistance value prepared by incorporating a dopant. It is possible to continuously maintain discharge by using such a low-resistance target. The inventors, however, have found that the use of the low-resistance target reduces transmissivity of the produced films or overly reduces the resistance value of the films, and hence characteristics suitable for solar cells as photoelectric conversion devices cannot be obtained.

Specifically, as a result of carrying out sputtering by using a low-resistance target which can maintain stable film production for a long time, and measuring transmissivity of a metal oxide film formed on a glass base plate by a transmissivity measuring device having an integrating sphere which collects light dispersed in all directions, it has been found that the metal oxide film formed by using the low-resistance target tends to have lower transmissivity than a metal oxide film formed by using a high-resistance target, and a solar cell using the former metal oxide film has reduced conversion efficiency.

Also, as a result of carrying out sputtering by using a low-resistance target which can maintain stable film production for a long period of time, and measuring the resistance of a metal oxide film formed on an SUS base plate by a film resistance measuring device based on a 4-terminal measuring method which can measure film resistance by flowing a current through the film and determining the voltage produced across the film, it has been found that the metal oxide (ZnO) film formed by using the low-resistance target tends to have lower film resistance than a metal oxide film formed by using a high-resistance target. For a solar cell which is made of the former metal oxide film, if the semiconductor layers are short-circuited somewhere, an excessive current flows between electrodes, conversion efficiency is reduced, and reliability is remarkably reduced.

The inventors have succeeded in solving the above-described problems based on the following findings attained through experiments and studies. When forming a metal oxide film by a sputtering process, abnormal discharge such as short-circuiting can be prevented and normal discharge can be stably maintained for a long time period by employing, as a target, a metal oxide target of which the specific resistance is not larger than 5.0 $\Omega$cm. The discharge is further stabilized by employing a target of which the crystal particles have a size not larger than 15 µm. Particularly, the discharge is still further stabilized by employing a target of which the specific resistance is in the range of 1 to 5 $\Omega$cm with variations (=(maximum value−minimum value)/2 (average value) not larger than ±30%.

Also, by employing, as the discharge gas, a mixture of Ar gas with added oxygen ($O_2$) gas and selecting the amount of the added oxygen (O$_2$) gas to be in the range of 0.1 to 10%, a film which has high transparency and a resistance value suitable as a transparent layer used as part of the rear reflecting layer of the solar cell as a photoelectromotive force device can be obtained and, as a result, conversion efficiency and reliability of the solar cell can be improved. On the other hand, when the film is used as a transparent electrode, a metal oxide layer which has high transmissivity and small resistance can be obtained by selecting the amount of the added O$_2$ gas to be in the range of 0.1 to 1%. As a result, conversion efficiency of the solar cell can be improved.

FIG. 1 shows one example of the structure of a thin film solar cell to which the present invention is applied. Referring to FIG. 1, reference numeral 101 is a conductive base plate on a Surface of which a reflecting layer 102 made of a material or metal having high reflectivity is formed (the metal forming the reflecting layer 102 may be dispensed with if the base plate itself is made of a material having sufficiently high reflectivity). On the metallic reflecting layer 102, there is formed a transparent conductive metal oxide layer 103 according to the present invention which is improved in transmissivity, has a suitable value of electrical resistance, and is highly resistant against etchants, etc. used in subsequent steps. A thin film semiconductor junction laminate 104 is formed on the transparent metal oxide layer 103. FIG. 1 shows an example in which an a-Si solar cell is formed of a semiconductor laminate 104 having a pin-junction as the photovoltaic semiconductor junction. 105 is an n-type a-Si layer, 106 is an i-type a-Si layer, and 107 is a p-type a-Si layer. A transparent electrode 108 and a comb-like collector electrode 109 are formed on the semiconductor junction laminate 104 in that order. The above-described structure provides the advantages described below.

(1) Since the reflecting layer 102 (or the base plate 101 itself) has high reflectivity and the transparent conductive metal oxide layer 103 has improved transmissivity due to the features of the present invention, a part of the light which has not been absorbed by the thin film semiconductor junction laminate 104 passes through the transparent conductive metal oxide layer 103 with high frequency, is reflected by the reflecting layer 102 (or the base plate 101 itself), and is then absorbed by the thin film semiconductor junction 104 after passing back through the transparent metal oxide layer 103. Therefore, the incident light such as the sunlight is effectively absorbed and conversion efficiency of the solar cell is improved.

(2) Since the transparent metal oxide layer 103 has a suitable resistance value, an excessive current will not flow and reliability of the solar cell can be prevented from deteriorating even if the thin film semiconductor layers are damaged or short-circuited.

A description will now be made of experiments demonstrating the advantages of the present invention.

Experiment 1

Figure 4:
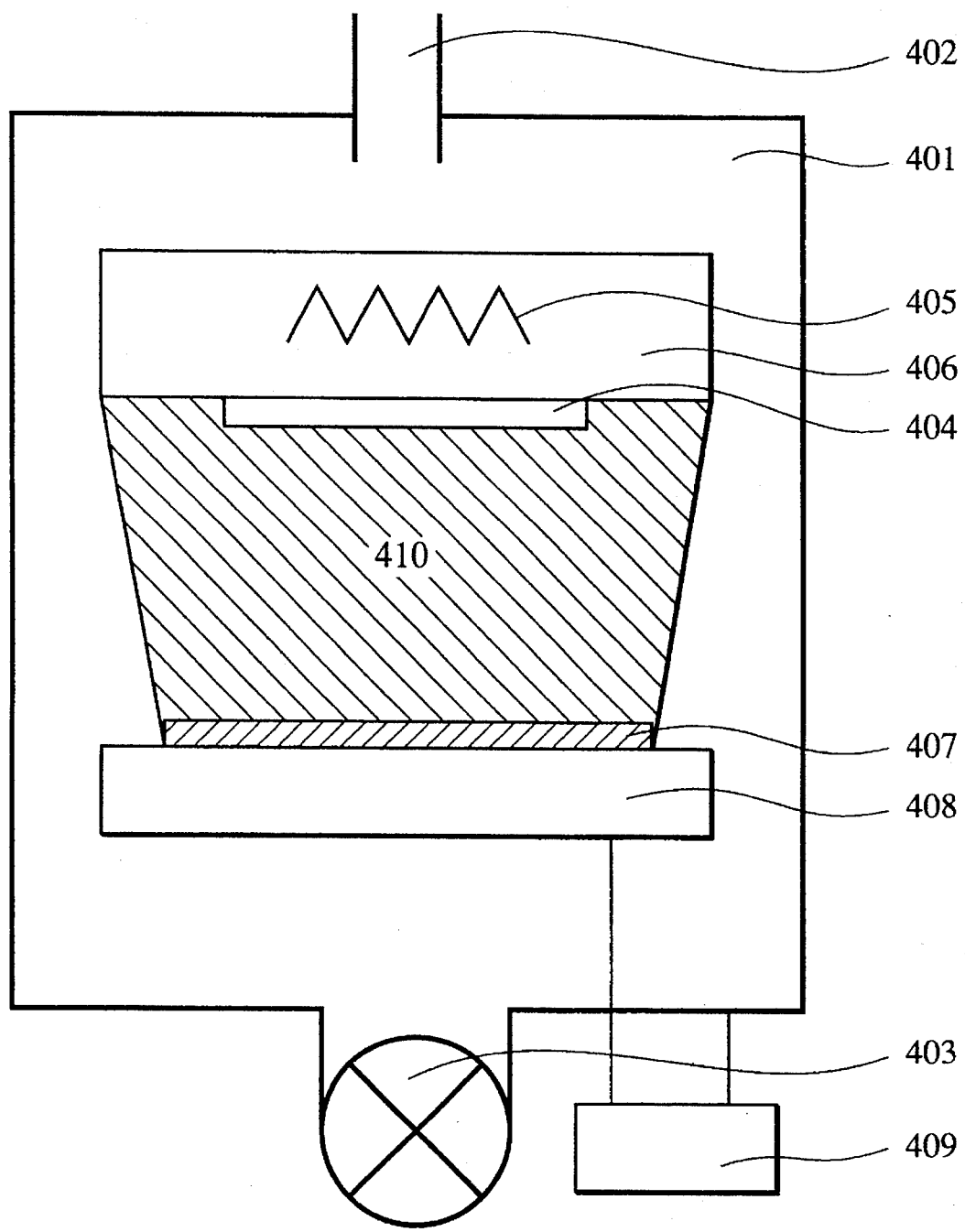
FIG. 4 is a schematic sectional view showing a sputtering apparatus suitable for forming a rear reflecting layer.

FIG. 4 shows one preferable example of a sputtering apparatus. Referring to FIG. 4, 401 is a deposition chamber which can be evacuated by an evacuation pump (not shown) to crate a vacuum. Inert gas such as argon (Ar) is introduced to the deposition chamber 401 at a predetermined flow rate through a gas conduit 402 connected to a gas cylinder (not shown). The Ar atmosphere in the deposition chamber 401 is held at a predetermined pressure by adjusting the opening of evacuation valve 403. A base plate 404 is fixed to the lower surface of an anode 406 in which a heater 405 is disposed. A cathode electrode 408 including a target 407 fixed to its upper surface is disposed in opposite relation to the anode 406. The target 407 is a block made of a metal oxide to be deposited.

The cathode electrode 408 is connected to a power supply 409. A high voltage of radio frequency (RF) or direct current (DC) is applied to the cathode electrode 408 from the power supply 409 to produce plasma 410 between the cathode and anode electrodes. Under the action of the plasma 410, metal oxide molecules of the target 407 are deposited on the base plate 404. The deposition rate can be raised by using a magnetron sputtering apparatus wherein a magnet is disposed in the cathode 408 to increase the intensity of the plasma.

ZnO targets (targets A to G) having a diameter of 4 inches and various resistance values were each set in a 4-terminal resistance measuring device (designed to measure a resistance value of an object by flowing a variable current between two terminals spaced apart by an arbitrary distance and then determining the resulting voltage by the remaining two terminals), and the resistance value at the center of which target was measured. After that, the targets were each mounted in a batch type sputtering apparatus shown in FIG. 4 and subjected to discharge continuously for 10 hours while observing the discharge state. For each target, films were formed at two different film forming rates, i.e., a low rate (20 Å/sec) and a high rate (50 Å/sec), and the obtained differences depending on the film forming rate were evaluated. Measured results are listed in Table 1 below. Criteria used to evaluate the discharge state in Table 1 are as follows:

o: no short-circuiting occurs
Δ: short-circuiting occurs, but discharge is self-recovered
X : short-circuiting occurs and discharge is not self-recovered once it occurs
XX: discharge is not developed

TABLE 1

| Target used | Target Resistance Ω cm | Discharge State 20 Å/sec | 50 Å/sec |
|---|---|---|---|
| Target A | 0.00022 | O | O |
| Target B | 0.0013 | O | O |
| Target C | 1.0 | O | O |
| Target D | 5.0 | O | O |
| Target E | 50.0 | O | X |
| Target F | 700.0 | Δ | X |
| Target G | 460000.0 | X | XX |

From Table 1, it is seen that low-rate film formation can maintain stable discharge for a long time at a higher resistance value than in high-rate film formation. It is also seen that the high-rate film formation can maintain stable film production for a long time if the target has a specific resistance not larger than 5 Ωcm.

Experiment 2

Figure 3:
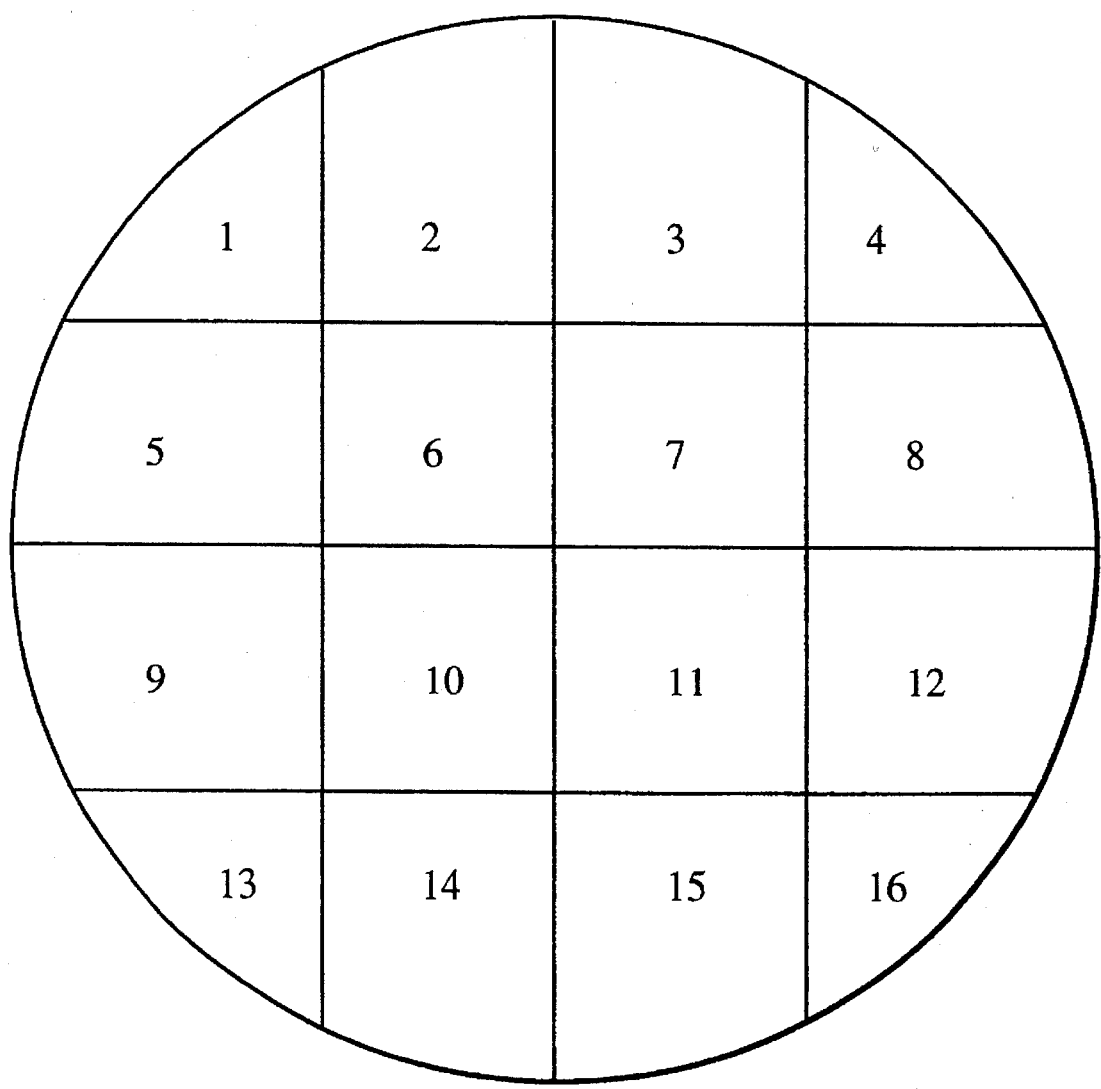
FIG. 3 is a schematic plan view showing the manner of dividing a 4-inch target which is used in Experiment 2 to measure variations in resistance value.

Films were formed in the same manner as in Experiment 1 by using various ZnO targets having resistance values ranging from 0.1 to 5 Ωcm, and the relationship between in-plane variations in resistance value, crystal structure, and the discharge state were observed. Variations in resistance value were measured by dividing the target surface into 16 sections as shown in FIG. 3, and determining the resistance value for each of the sections by the 4-terminal resistance measuring method. The crystal structure of each of the ZnO targets was observed by using a SEM. Measured and observed results are listed in Table 2 below.

TABLE 2

| Target Used | Target Resistance (at center) Ω cm | Variations in Target Resistance (16 points) Ω cm % | Discharge State 50 Å/sec |
|---|---|---|---|
| Target 1 | 0.28 | 0.27–0.31 ± 7.1% | O |
| Target 2 | 0.51 | 0.45–0.61 ± 15.7% | O |
| Target 3 | 1.2 | 1.0–1.5 ± 20.8% | O |
| Target 4 | 3.3 | 3.0–11.2 ± 124% | X |
| Target 5 | 4.8 | 4.8–5.0 ± 18.8% | O |
| Target 6 | 4.5 | 2.0–5.0 ± 33.3% | Δ |

Observation by SEM 1. uniform crystal structure with crystal particle diameters of about 5 microns
2. uniform crystal structure with crystal particle diameters of about 3–8 microns
3. uniform crystal structure with crystal particle diameters of about 5–9 microns
4. non-uniform crystal structure with crystal particle diameters of about 10–20 microns
5. uniform crystal structure with crystal particle diameters of about 10 microns
6. uniform crystal structure with crystal particle diameters of about 8–14 microns From Table 2, it is seen that even the commercially available targets have significant in-plane variations in resistance value and the discharge state is affected by these variations. It is also seen that the discharge state is stabilized by using, in particular, the targets with variations not larger than ±30%. The discharge state is further stabilized by using the targets in which the crystal particles have a maximum diameter not larger than 15 μm.

Experiment 3

The ZnO targets (Targets A to E) whose resistance values were measured in Experiment 1 were installed in the batch type sputtering apparatus as in Experiment 1. Then, mixtures of Ar gas with 0, 0.1, 0.3, 0.5, 1.0, 3.0, 5.0 and 10.0% added $O_2$ gas were introduced to the apparatus in turn and ZnO was deposited to a thickness of 20,000 Å on a glass substrate of 5×5 cm size by the DC magnetron sputtering process using each of these gas mixtures. In each case, the base plate temperature was set at room temperature and the deposition rate was 70 Å/sec.

The various ZnO deposited film samples were then subjected to measurement of transmissivity of light with wavelengths ranging from 600 to 900 nm. Table 3 lists, by way of example, transmissivity of Targets A to E at a wavelength of 800 nm, which is particularly important for a-Si based solar cells.

TABLE 3

| | | Transmissivity (%) at 800 nm Amount of Added $O_2$ (%) | | | | | | | |
|---|---|---|---|---|---|---|---|---|---|
| Target Used | Target Resistance Ω cm | 0 | 0.1 | 0.3 | 0.5 | 1.0 | 3.0 | 5.0 | 10.0 |
| Target A | 0.00022 | 77.0 | 80.0 | 82.0 | 85.0 | 87.0 | 90.0 | 90.0 | 89.0 |
| Target B | 0.0013 | 77.0 | 80.0 | 85.0 | 87.0 | 90.0 | 90.0 | 91.0 | 89.0 |
| Target C | 1.0 | 87.0 | 90.0 | 90.0 | 91.0 | 91.0 | 92.0 | 90.0 | 88.0 |
| Target D | 5.0 | 89.0 | 90.0 | 91.0 | 91.0 | 92.0 | 92.0 | 90.0 | 89.0 |
| Target E | 50.0 | 91.0 | 91.0 | 92.0 | 92.0 | 92.0 | 91.0 | 88.0 | 88.0 |

Next, Ag was deposited 600 Å on a stainless steel base plate (SUS 430) of 5×5 cm size by a DC magnetron sputtering process at room temperature, and the resulting base plate was then placed in the batch type sputtering apparatus. Subsequently, as with the above samples for measurement of transmissivity, ZnO films deposited were to a thickness of 20,000 Å using each of the gas mixtures. On the ZnO film, a collector electrode having a width of 300 microns was then formed. The film resistance of each of thus-obtained samples was measured by the 4-terminal resistance measuring method. Measured results are listed in Table 4 below.

As seen from Tables 3 and 4, if the film formation is carried out without addition of $O_2$ gas, the transmissivity and the resistance are reduced for each of the films formed by using the low-resistance targets (A, B) which provide a good discharge state, but if 0.1 to 10% $O_2$ gas is added to Ar gas, the transparency and the resistance of each film have optimum values for use as the rear reflecting layer of the solar cell. It is also seen that the transmissivity and the resistance of each of the films formed by adding 0.1 to 1% $O_2$ gas have values suitable for use as the transparent electrode.

TABLE 4

| Target Used | Target Resistance Ω cm | Film Resistance Amount of Added O₂ (%) | | | | | | | |
|---|---|---|---|---|---|---|---|---|---|
| | | 0 | 0.1 | 0.3 | 0.5 | 1.0 | 3.0 | 5.0 | 10.0 |
| Target A | 0.00022 | 0.00016 | 0.0022 | 0.0099 | 0.018 | 0.045 | 0.089 | 0.66 | 3.2 |
| Target B | 0.0013 | 0.00089 | 0.0066 | 0.055 | 0.089 | 0.17 | 3.0 | 45.0 | 880.0 |
| Target C | 1.0 | 0.032 | 0.098 | 0.45 | 0.66 | 1.2 | 89.0 | 550.0 | 8800.0 |
| Target D | 5.0 | 0.055 | 0.022 | 0.73 | 5.5 | 97.0 | 220.0 | 8200.0 | 56000.0 |
| Target E | 50.0 | 0.042 | 0.18 | 1.0 | 5.6 | 77.0 | 300.0 | 7800.0 | 44000.0 |

Experiment 4

AG was deposited 600 Å on a stainless steel base plate (SUS 430) of 5×5 cm by a DC magnetron sputtering process (base plate temperature=room temperature). On the deposited Ag layer, ZnO was deposited to a thickness of 20,000 Å by a DC magnetron sputtering process at a deposition rate of 70 Å/sec by using the ZnO target B ($1.3 \times 10^{-3}$ Ωcm) (base plate temperature=room temperature) while mixtures of Ar gas with 0, 0.1, 0.3, 0.5, 1.0, 3.0, 5.0 and 10.0% added O₂ gas were introduced in turn, thereby forming a rear reflecting layer.

On the thus-formed rear reflecting layer, by using a glow discharge decomposition process, a 200 Å thick a-Si layer having n-type conductivity was deposited from $SiH_4$ and $PH_3$ as raw material gases, a 4000 Å thick a-Si layer having i-type conductivity was deposited from $SiH_4$ as a raw material gas, and a 100 Å thick micro-crystalline (uc)-Si layer having p-type conductivity was deposited from $SiH_4$, $BF_3$, and $H_2$ as raw material gases, thereby forming a thin film semiconductor junction laminate (note that while a-Si formed by the glow discharge decomposition process using $SiH_4$, etc. contains about 10% hydrogen (H) and is generally expressed by a-Si:H, it is simply expressed by a-Si in this specification for the sake of brevity).

Subsequently, on the thin film semiconductor junction, laminate a 650 Å thick ITO film was formed as a transparent electrode by the resistance heating evaporation method, and a collector electrode having a width of 300 microns was then formed using a silver paste, thereby manufacturing solar cells. Results of measurement of the conversion efficiency of the solar cells are listed in Table 5 below.

TABLE 5

| | Amount of Added O₂ (%) | | | | | | | |
|---|---|---|---|---|---|---|---|---|
| | 0 | 0.1 | 0.3 | 0.5 | 1.0 | 3.0 | 5.0 | 10.0 |
| Transmissivity (%) | 77.0 | 80.0 | 85.0 | 87.0 | 90.0 | 90.0 | 91.0 | 89.0 |
| Efficiency (%) | 8.5 | 8.8 | 9.2 | 9.4 | 9.7 | 9.7 | 9.9 | 9.6 |

It is seen from Table 5 that rear reflecting layers having higher transparency are obtained with amounts of the added O₂ gas ranging from 0.1 to 10% and hence conversion efficiency of the solar cells is increased.

The transparent conductive metal oxide layer for use in the thin film solar cell of the present invention will now be described below in detail.

Usable as the material of the transparent metal oxide layer are $In_2O_3$, $SnO_2$, CdO, $CdSnO_4$, TiO, as well as ZnO (note that the composition ratio of the compound given herein is not always in agreement with the actual ratio). In the solar cell, the transparent conductive metal oxide layer is employed as part of the rear reflecting layer and as the transparent electrode.

When employed as part of the rear reflecting layer, it is generally preferable for the transparent metal oxide layer to have a light transmissivity as high as possible, but the transparent metal oxide layer is not necessarily transparent to the light having wavelengths that are absorbed by the thin film semiconductors. While the transparent metal oxide layer should have sufficient resistance for suppressing current caused by pin holes or the like, its resistance value must be held within the range in which the influence of the resulting series resistance loss on the conversion efficiency of the solar cell is negligible. For this reason, the preferable rang of specific resistance of the transparent metal oxide layer is 0.1 to 10 Ωcm. The thickness of the transparent oxide layer is preferably as thin as possible from the standpoint of transparency, but an average thickness not less than 1000 Å is required to provide the layer surface with a texture structure for trapping light with the aid of the roughness of the base plate). Taking into account reliability as well, a layer thickness larger than the above average thickness is necessary.

When employed as the transparent electrode, the transparent metal oxide layer is an important component relating to the capabilities of a photoelectromotive force device, i.e. the transmissivity and the specific resistance of the transparent oxide layer are parameters directly affecting the capabilities of the photoelectromotive force device. It thus is preferable that the transmissivity be as high as possible and the specific resistance as low as possible. Practically, since the transparent electrode used in the solar cell has a thickness not larger than 1000 Å, characteristics of the solar cell are improved with the higher transmissivity in spite of a small reduction in the resistance value.

The present invention will be described below in more detail in conjunction with Examples, but it should be understood that the present invention is not limited to the following Examples.

Example 1

Figure 5:
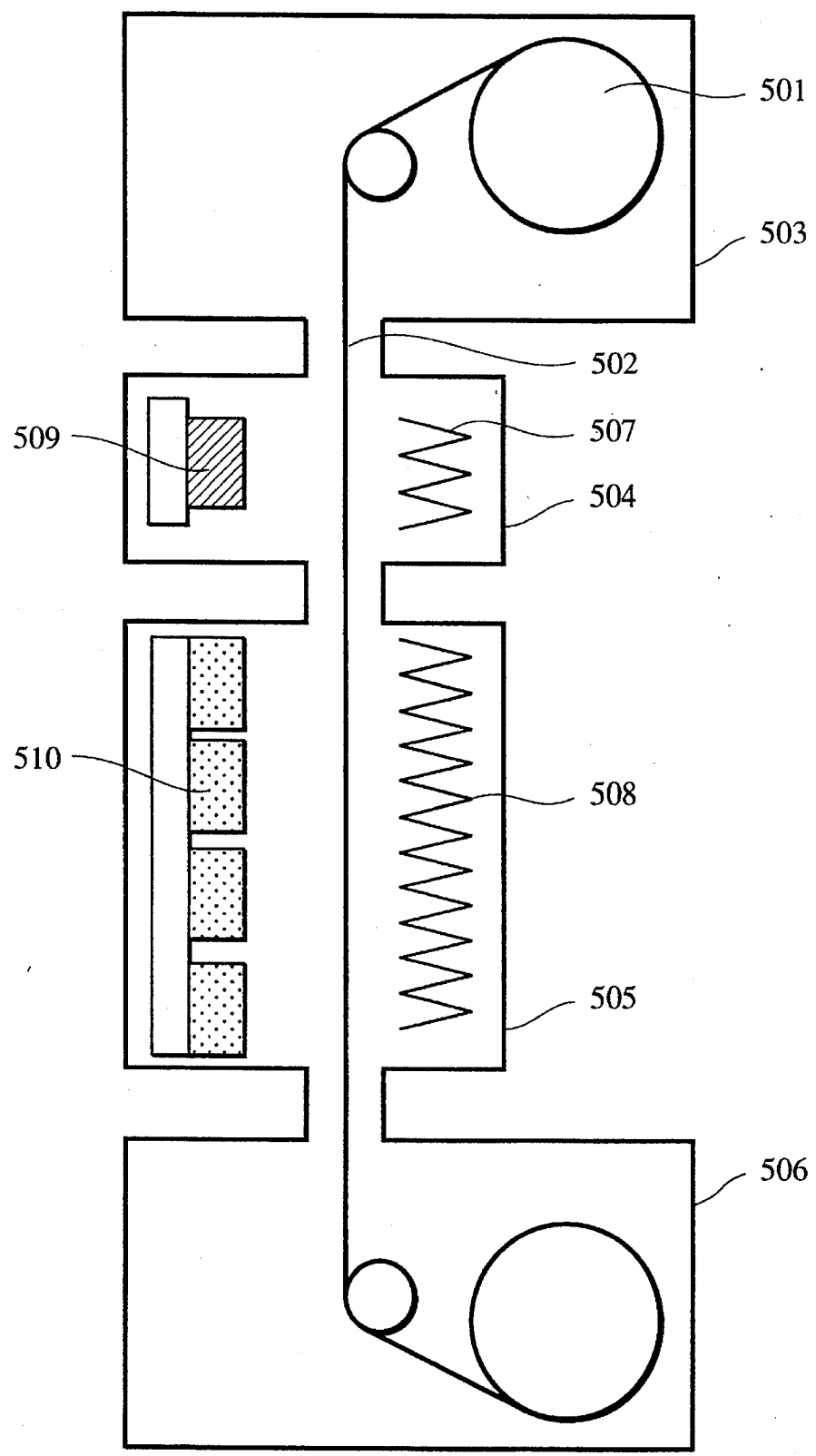
FIG. 5 is a schematic sectional view showing another sputtering apparatus suitable for forming the rear reflecting layer.

A rear reflecting layer comprising a reflecting layer and a transparent metal oxide layer was formed in a continuous manner by using an apparatus shown in FIG. 5. A roll 501 cleaned stainless steel sheet 502 (350 mm wide, 0.2 mm thick and 500 m long) was set in a base plate delivery chamber 503 of the apparatus. From the chamber 503, the stainless sheet 502 was advanced to a base plate roll-up chamber 506 through a reflecting layer deposition chamber 504 and a transparent layer deposition chamber 505. The sheet 502 was heated by base plate heaters 507, 508 in the respective deposition chambers to desired temperatures. A target 509 in the reflecting layer deposition chamber 504 was made of Al with a purity of 99.99% for depositing Al on the sheet 502 by DC magnetron sputtering. A target 510 in the transparent layer deposition chamber 505 was made of ZnO (specific resistance: 0.5 Ωcm, maximum crystal particle size: 8 μm) with a purity of 99.5% (the 0.5% balance being Cu) for depositing ZnO on the deposited Al by DC magnetron sputtering. In view of the deposition rate and the desired film thickness, four targets 510 were employed. The deposition rate in this Example was set to 50 k/sec.

The rear reflecting layer was formed by using the apparatus thus constructed. The sheet feed speed was set to 20 cm per minute and the base plate temperature was adjusted to 250° C. during the deposition of ZnO by using only the base plate heater 508. A ZnO film was continuously formed for 2 hours by introducing Ar gas with 5% $O_2$ gas while the pressure was adjusted to 1.5 mTorr. A DC voltage of 500 V was applied to each cathode. A current of 4 amperes passed through the target 509, and a current of 4 amperes passed through each of the targets 510. As a result of measuring the rolled-up sheet, the thickness of the Al layer was determined to be 1600 Å and the thickness of the ZnO layer was 3800 A on average.

Figure 6:
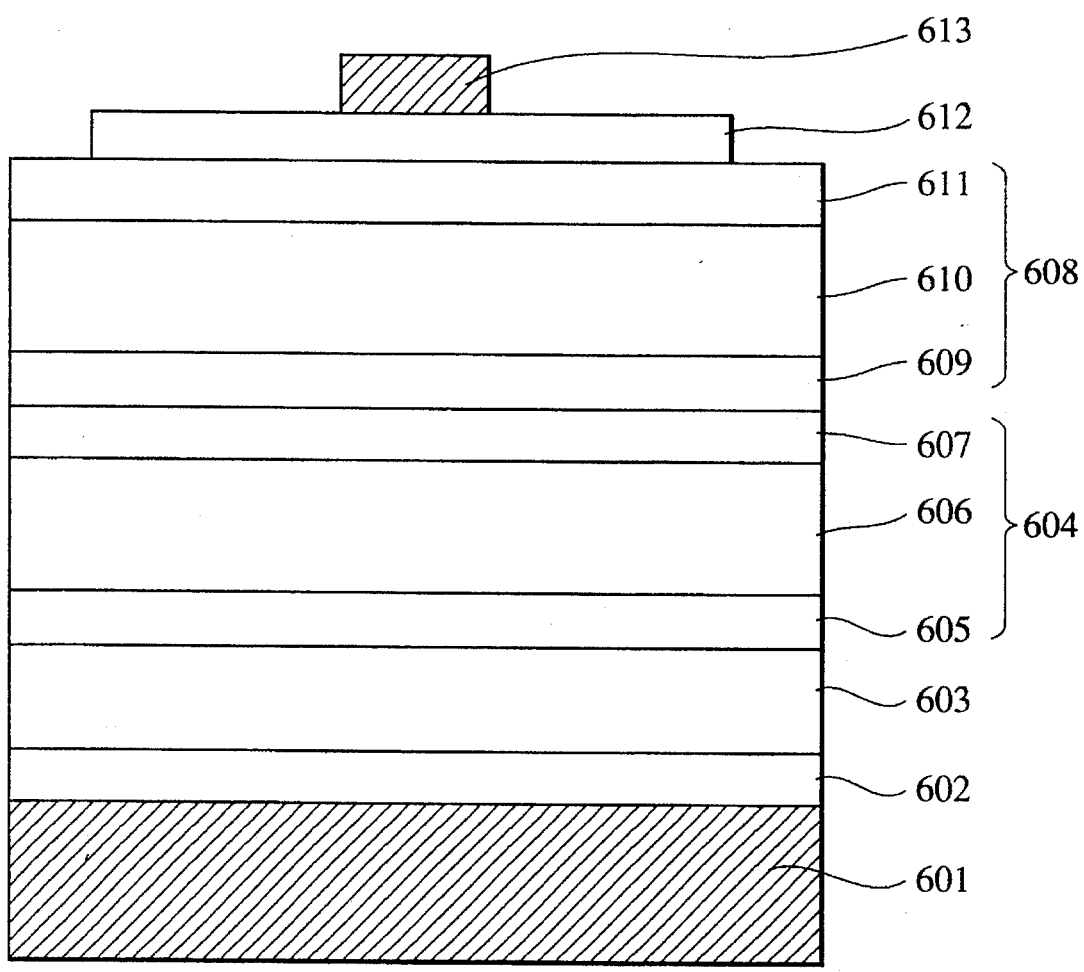
FIG. 6 is a schematic sectional view showing another example of the solar cell as a photoelectric conversion device to which the present invention is suitably applied.

On the ZnO layer, an a-SiGe/a-Si type tandem solar cell of the structure shown in FIG. 6 was formed. In FIG. 6, reference numeral 601 denotes a base plate as a support member, 602 a reflecting layer made of metal, 603 a transparent conductive layer, 604 a bottom cell laminate, and 608 a top cell laminate. Further, 605, 609 denote n-type A-Si layers, 607, 611 p-type μc-Si layers, 606 an i-type a-SiGe layer, and 610 an i-type a-si layer. These semiconductor layers were fabricated in turn in a continuous manner by using a roll-to-roll film forming apparatus as disclosed in U.S. Pat. No. 4,492,181. A transparent electrode 612 was deposited by using a sputtering apparatus similar to that shown in FIG. 5. 613 is a collector electrode. After patterning the transparent electrode and forming the collector electrode, the sheet 502 was cut into separate devices. By thus carrying out all the steps in a continuous manner, the efficiency of mass production could be increased.

Comparative Example 1

For comparison, solar cells were manufactured in the same manner as in Example 1 except that 15% $O_2$ gas was added to Ar gas during the deposition of ZnO.

100 samples were manufactured by each of the methods described in Example 1 and Comparative Example 1, and their characteristics were evaluated under irradiation of light of AM 1.5 (100MW/cm$^2$). As a result, the samples of Comparative Example 1 had photoelectric conversion efficiency of 10.8±0.3%, whereas the samples of Example 1 showed excellent photoelectric conversion efficiency of 11.2±0.2% with good reproducibility.

The conversion efficiency of the solar cells measured after leaving them to stand in an environment of a temperature of 50° C. and humidity of 90% for 1000 hours was 9.2±0.9% for Comparative Example 1 and 10.8±0.6% for Example 1. Thus, no substantial deterioration in conversion efficiency was observed for the samples of Example 1.

Further, another 100 samples were manufactured by each of the methods described in Example 1 and Comparative Example 1, and their conversion efficiencies were measured after exposure to light equivalent to AM 1.5 under open circuit conditions for 600 hours. The conversion efficiency of the samples of Comparative Example 1 was considerably reduced to 9.0±0.5%, whereas the samples of Example 1 had a conversion efficiency of 10.5±0.3%, indicating only a small deterioration by light.

Consequently, by forming the rear reflecting layer in accordance with the method of the present invention, there can be manufactured thin film solar cells which have high conversion efficiency and excellent reliability.

Example 2

A solar cell of the structure shown in FIG. 6 was manufactured by depositing the reflecting layer, the transparent layer, and the semiconductor layers in the same manner as in Example 1. A metal oxide transparent electrode was formed by using a sputtering apparatus similar to that shown in FIG. 5 in which the film forming was continued for 20 hours while 0.3% $O_2$gas was added to Ar gas during discharge in accordance with the present invention. The subsequent steps were also performed in the same manner as in Example 1. By thus carrying out all the steps in a continuous manner, the efficiency of mass production could be increased.

100 samples were manufactured by the above method and their characteristics were evaluated under irradiation of light of AM 1.5 (100 mW/cm$^2$). As a result, the samples showed excellent photoelectric conversion efficiency of 11.5±0.2% with good reproducibility. The conversion efficiency of the solar cells measured after leaving them to stand at a temperature of 50° and humidity of 90% for 1000 hours was 11.0±0.6%, i.e., there was no appreciable deterioration. Further, another 100 samples manufactured by the above method were exposed to light equivalent to AM 1.5 under open circuit conditions for 600 hours. The conversion efficiency of the samples measured after the exposure was 10.8±0.3%, indicating only a small deterioration by light.

Consequently, by forming the rear reflecting layer and the transparent electrode in accordance with the method of the present invention, there can be manufactured thin film solar cells which have high conversion efficiency and excellent reliability.

Example 3

In this Example, an A-Si photoelectromotive force device of the structure shown in the schematic sectional view of FIG. 1 (but with no reflecting layer 102), including the pin-type junction, was manufactured. On an Al base plate 101 of 5×5 cm size having a polished surface and a thickness of 1 mm, the ZnO layer 103 as deposited in an average thickness of 4000 Å by the apparatus shown in FIG. 4 at a substrate temperature of 250° C. and a deposition rate of 70 Å/sec by using a ZnO target (specific resistance: 0.3 Ωcm, maximum crystal particle size: 7 μm) with 5% Cu added. The ZnO surface exhibited a texture structure having roughness.

Subsequently, the base plate having the thus-formed lower electrode was placed in a commercially available capacity coupling type high-frequency CVD apparatus (CHJ-3030 by ULVAC Co.). An evacuation pump was operated to purge air in a reaction vessel through an evacuation pipe with steps of rough evacuation and then high-vacuum evacuation. At this time, the surface temperature of the base plate was controlled to 250° C. by a temperature control unit. When a sufficiently high degree of vacuum was created, $SiH_4$ of 300 sccm, $SiF_4$ of 4 sccm, $PH_3/H_2$ (diluted with 1% $H_2$) of 55 sccm, and $H_2$ of 40 sccm were introduced to the reaction vessel through respective gas conduits, and openings of throttle valves were adjusted to keep the internal pressure of the reaction vessel at 1 Torr. Immediately after the pressure was stabilized, power of 200 W was applied to the reaction vessel from a high-frequency power supply. Plasma was maintained for 5 minutes and the A-Si layer 105 having n-type conductivity was formed on the ZnO transparent layer 103. After evacuating the reaction vessel again, $SiH_4$ of 300 sccm, $SiF_4$ of 4 sccm, and $H_2$ of 40 sccm were introduced through the respective gas conduits, and openings of the throttle valves were adjusted to keep the internal pressure of the reaction vessel at 1 Torr. Immediately after the pressure was stabilized, power of 150 W was applied to the reaction vessel from the high-frequency power supply and plasma was maintained for 40 minutes. The a-Si layer 106 having i-type conductivity was thereby formed on the a-Si layer 105 having n-type conductivity. After evacuating the reaction vessel again, 50 sccm $SiH_4$, 50 sccm $BF_3/H_2$ (diluted with 1% $H_2$, and 500 sccm $H_2$ were introduced through the respective gas conduits, and openings of the throttle valves were adjusted to keep the internal pressure of the reaction vessel at 1 Torr. Immediately after the pressure was stabilized, power of 300 W was applied to the reaction vessel from the high-frequency power supply. Plasma was maintained for 2 minutes and the μc-Si layer 107 having p-type conductivity was formed on the a-Si layer 106 having i-type conductivity. Then, the sample was taken out of the high-frequency CVD apparatus and, after depositing ITO thereon in a resistance heating vacuum evaporation apparatus, a paste containing a ferrous chloride solution was printed on the deposited ITO so that the transparent electrode 108 was formed in a desired pattern. Finally, an AG paste was screen-printed and then hardened to form the collector electrode 109, thereby completing a thin film semiconductor solar cell.

10 samples were manufactured by the above method and their characteristics were evaluated under irradiation of light of AM 1.5 (100 $mW/cm^2$). As a result, the samples showed excellent photoelectric conversion efficiency of 9.5±0.2% with good reproducibility. The conversion efficiency of the solar cells measured after leaving them to stand at a temperature of 50° C. and humidity of 90% for 1000 hours was 9.2±0.5% with no appreciable deterioration.

As described hereinabove, according to the present invention, it is possible to solve the problem, i.e., a reduction in transparency and film resistance, which has heretofore been raised in high-rate film formation. Specifically, since the transparent electrode has higher transmissivity, the intensity of incident light is increased and a larger amount of light is absorbed by the thin film semiconductors. Also, since the rear reflecting layer was higher reflectivity, light is effectively trapped in the thin film semiconductor layers and thus the amount of light absorbed therein is increased, resulting in the solar cell with higher conversion efficiency.

In addition, with the presence of the transparent layer as part of the rear reflecting layer, metal atoms are less likely to diffuse into the semiconductor films. If a short-circuit occurs somewhere in the thin film semiconductors, leakage current is suppressed by appropriate electrical resistance of the transparent layer. Because of increased resistance against chemicals, a possibility that solar cells may be damaged or fail in subsequent steps during manufacture is reduced. As a result, highly reliable solar cells can be produced.

Furthermore, the rear reflecting layer can be manufactured as part of a process suitable for efficient mass production, e.g., a roll-to-roll process.

Consequently, the present invention greatly contributes to more widespread use of solar power generation.

What is claimed is:

1. A method of forming a transparent conductive layer by a sputtering process, wherein said transparent conductive layer is formed under discharge of a mixture of Ar gas with 0.1 to 10% oxygen gas added by using a metal oxide target which has a specific resistance not larger than 5.0 Ωcm and a crystal particle size not larger than 15 microns.

2. A method of forming a transparent conductive layer according to claim 1, wherein the specific resistance of said target is in the range of 0.1 Ωcm to 5.0 Ωcm and variations of the specific resistance are not larger than ±30%.

3. A method of forming a transparent conductive layer according to claim 1, wherein said sputtering process is a DC sputtering process.

4. A method of forming a transparent conductive layer according to claim 1, wherein said target contains a minor amount of Cu.

5. A method of forming a transparent conductive layer according to claim 1, wherein said oxygen gas is added to said Ar gas in the amount of 0.1 to 1%.

6. A photoelectric conversion device comprising a first transparent conductive layer, a semiconductor layer, and a second transparent conductive layer, wherein said first and/or second transparent conductive layer is formed by a sputtering process under discharge of a mixture of Ar gas with 0.1 to 10% added oxygen gas by using a metal oxide target which has a specific resistance not larger than 5.0 Ωcm and a crystal particle size not larger than 15 microns.

7. A photoelectric conversion device according to claim 6, wherein the specific resistance of said target is in the range of 0.1 Ωcm to 5.0 Ωcm and variations of the specific resistance are not larger than ±30%.

8. A photoelectric conversion device according to claim 6, wherein said sputtering process is a DC sputtering process.

9. A photoelectric conversion device according to claim 6, wherein said target contains a minor amount of Cu.

10. A photoelectric conversion device according to claim 6, wherein said oxygen gas is added to said Ar gas in the amount of 0.1 to 1%.

11. A photoelectric conversion device according to claim 6, wherein said semiconductor layer has a pin-junction.

12. A photoelectric conversion device according to claim 6, wherein said semiconductor layer is a non-single crystal semiconductor.

13. A photoelectric conversion device according to claim 6, wherein said first transparent conductive layer is adjacent to a reflecting layer.

14. A photoelectric conversion device according to claim 6, wherein said photoelectric conversion device is an photoelectromotive force device.

15. A method of forming a photoelectric conversion device, comprising the steps of:

forming a first transparent conductive layer on a support member by a sputtering process under discharge of a mixture of Ar gas with 0.1 to 10% oxygen gas by using a metal oxide target which has a specific resistance not larger than 5.0 Ωcm and a crystal particle size not larger than 15 microns, forming a semiconductor layer on said first transparent conductive layer, and forming a second transparent conductive layer on said semiconductor layer.

16. A method of forming a photoelectric conversion device according to claim 15, wherein the specific resistance of said target is in the range of 0.1 Ωcm to 5.0 Ωcm and variations of the specific resistance are not larger than ±30%.

17. A method of forming a photoelectric conversion device according to claim 15, wherein said sputtering process is a DC sputtering process.

18. A method of forming a photoelectric conversion device according to claim 15, wherein said target contains a minor amount of Cu.

19. A method of forming a photoelectric conversion device according to claim 15, wherein said oxygen gas is added to said Ar gas in the amount of 0.1 to 1%.

20. A method of forming a photoelectric conversion device according to claim 15, wherein said semiconductor layer has a pin-junction.

21. A method of forming a photoelectric conversion device according to claim 15, wherein said semiconductor layer is a non-single crystal semiconductor.

22. A method of forming a photoelectric conversion device according to claim 15, wherein said support member has a reflecting layer thereon.

23. A method of forming a photoelectric conversion device according to claim 15, wherein said photoelectric conversion device is a photoelectromotive force device.

24. A method of forming a photoelectric conversion device, comprising the steps of:

forming a first transparent conductive metal oxide layer on a support member, forming a semiconductor layer on said first transparent conductive layer, and forming a second transparent conductive metal oxide layer on said semiconductor layer by a sputtering process in a mixture of Ar gas with 0.1 to 10% oxygen gas and using a metal oxide target which has a specific resistance not larger than 5.0 $\Omega$cm and a crystal particle size not larger than 15 microns.

25. A method of forming a photoelectric conversion device according to claim 24, wherein the specific resistance of said target is in the range of 0.1 $\Omega$cm to 5.0 $\Omega$cm and variations of the specific resistance are not larger than ±30%.

26. A method of forming a photoelectric conversion device according to claim 24, wherein said sputtering process is a DC sputtering process.

27. A method of forming a photoelectric conversion device according to claim 24, wherein said target contains a minor amount of Cu.

28. A method of forming a photoelectric conversion device according to claim 24, wherein said oxygen gas is added to said Ar gas in the amount of 0.1 to 1%.

29. A method of forming a photoelectric conversion device according to claim 24, wherein said semiconductor layer has a pin-junction.

30. A method of forming a photoelectric conversion device according to claim 24, wherein said semiconductor layer is a non-single crystal semiconductor.

31. A method of forming a photoelectric conversion device according to claim 24, wherein said support member has a reflecting layer thereon.

32. A method of forming a photoelectric conversion device according to claim 24, wherein said photoelectric conversion device is a photoelectromotive force device.

* * * * *

UNITED STATES PATENT AND TRADEMARK OFFICE
CERTIFICATE OF CORRECTION

PATENT NO. : 5,603,778
DATED : February 18, 1997
INVENTOR : YUICHI SONODA

It is certified that error appears in the above-identified patent and that said Letters Patent is hereby corrected as shown below:

ON TITLE PAGE

[57] ABSTRACT

Line 12, "oxide" should read --metal oxide--
Line 13, "a" should read --and a--.

COLUMN 1

Line 57, "light-at" should read --light at--.

COLUMN 4

Line 64, "(=(maximum" should read --= (maximum--.

COLUMN 5

Line 16, "Surface" should read --surface--;
Line 60, "crate" should read --create--.

COLUMN 10

Line 27, "rang" should read --range--.

UNITED STATES PATENT AND TRADEMARK OFFICE
CERTIFICATE OF CORRECTION

PATENT NO. : 5,603,778

DATED : February 18, 1997

INVENTOR : YUICHI SONODA

It is certified that error appears in the above-identified patent and that said Letters Patent is hereby corrected as shown below:

<u>COLUMN 11</u>

Line 8,   "50k/sec." should read --50Å/sec.--;
   Line 27, "A-Si" should read --a-Si--;
   Line 29, "a-si" should read --a-Si--.

<u>COLUMN 14</u>

Line 46, "an" should read --a--.

Signed and Sealed this

Twelfth Day of August, 1997

Attest:

BRUCE LEHMAN

Attesting Officer     Commissioner of Patents and Trademarks